(12) United States Patent
Wang et al.

(10) Patent No.: US 11,116,097 B2
(45) Date of Patent: Sep. 7, 2021

(54) DAMPING COVERS FOR POWER INVERTER MODULES AND INTEGRATED POWER ELECTRONICS MODULES UTILIZING THE SAME

(71) Applicant: GM GLOBAL TECHNOLOGY OPERATIONS LLC, Detroit, MI (US)

(72) Inventors: Qigui Wang, Rochester Hills, MI (US); Song He, Troy, MI (US); Seongchan Pack, West Bloomfield, MI (US); Angela P. Willis, Ortonville, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 5 days.

(21) Appl. No.: 16/528,848

(22) Filed: Aug. 1, 2019

(65) Prior Publication Data

US 2021/0037665 A1 Feb. 4, 2021

(51) Int. Cl.
*H05K 5/03* (2006.01)
*G10K 11/168* (2006.01)
*B60R 16/02* (2006.01)
*B32B 5/18* (2006.01)
*B32B 15/04* (2006.01)
*B32B 15/20* (2006.01)
*H05K 7/20* (2006.01)

(52) U.S. Cl.
CPC ............ *H05K 5/03* (2013.01); *B32B 5/18* (2013.01); *B32B 15/046* (2013.01); *B32B 15/20* (2013.01); *B60R 16/02* (2013.01); *G10K 11/168* (2013.01); *B32B 2266/045* (2013.01); *B32B 2307/102* (2013.01); *B32B 2605/00* (2013.01); *H05K 7/20872* (2013.01); *H05K 7/20927* (2013.01)

(58) Field of Classification Search
CPC ........................................................ H05K 5/03
USPC ........................................................ 174/520
See application file for complete search history.

(56) References Cited

U.S. PATENT DOCUMENTS

| | | | | |
|---|---|---|---|---|
| 3,873,392 A | * | 3/1975 | Niebylski | ............... B32B 15/08 428/141 |
| 8,813,896 B2 | * | 8/2014 | Littlefield | ................ B60K 8/00 180/274 |
| 9,391,496 B2 | * | 7/2016 | Triantos | ................. H02K 5/225 |
| 2003/0194548 A1 | * | 10/2003 | McLeod | .............. B62D 29/002 428/304.4 |

(Continued)

Primary Examiner — Stanley Tso
(74) Attorney, Agent, or Firm — Quinn IP Law

(57) ABSTRACT

A damping cover for an integrated power electronics module (IPEM), the damping cover generally defined by a top side and a bottom side, wherein the bottom side is configured to mate adjacent with or contiguous to a power inverter module (PIM) of the IPEM. The damping cover can include an aluminum foam core including a top surface generally corresponding to the top side of the damping cover and a bottom surface generally corresponding to the bottom side of the damping cover and a polymeric over-molding or non-porous aluminum outer layer covering the top surface and/or a polymeric over-molding or non-porous aluminum outer layer covering the bottom surface. The bottom side of the damping cover can mate adjacent with or contiguous to the PIM. The polymeric material over-molding can completely impregnate the aluminum foam core. The aluminum foam core can have a density of about 0.15 g/cm³ to about 1.0 g/cm³.

19 Claims, 3 Drawing Sheets

(56) References Cited

U.S. PATENT DOCUMENTS

2014/0204555 A1\* 7/2014 Ivan ................. F16H 57/02
                                                                 361/818
2019/0098777 A1\* 3/2019 Nakatsu ............. H05K 7/20927

\* cited by examiner

DAMPING COVERS FOR POWER INVERTER MODULES AND INTEGRATED POWER ELECTRONICS MODULES UTILIZING THE SAME

BACKGROUND

Hybrid vehicles and electric vehicles are increasingly utilizing integrated power electronics modules which generally include a power inverter module integrated (i.e., packaged) with one or more components such as motor/generators, pumps, clutches, and other components. Power inverter modules and vehicle components such as motor/generators, pumps, and clutches are known to cause noise and/or vibrations which operators of an appurtenant vehicle may find undesirable.

SUMMARY

Provided are damping covers for an integrated power electronics module (IPEM). A damping cover can be generally defined by a top side and a bottom side, and the bottom side can be configured to mate adjacent with or contiguous to a power inverter module of the IPEM. The damping cover can include an aluminum foam core including a top surface generally corresponding to the top side of the damping cover and a bottom surface generally corresponding to the bottom side of the damping cover, and a polymeric material over-molding or an aluminum plate layer covering the top surface of the aluminum foam core. The damping cover can include a polymeric material over-molding covering the top surface of the aluminum foam core and an aluminum plate layer covering the polymeric material over-molding. The polymeric material over-molding can cover the top surface and the bottom surface of the aluminum foam core. The damping cover further can include an aluminum plate layer covering the polymeric material over-molding on the bottom surface of the aluminum foam core and/or the top surface of the aluminum foam core. The polymeric material over-molding can substantially impregnate the aluminum foam core. The aluminum foam core can have a density of about 0.15 grams per cubic centimeter to about 1.0 grams per cubic centimeter. The aluminum foam can have an average pore size of about 0.5 millimeters to about 15 millimeters. The aluminum foam can be pure aluminum or one or more aluminum alloys. The polymeric material can be one or more elastomers, one or more thermoplastics, one or more thermosets, and combinations thereof. The aluminum foam can be formed into a non-planar geometry by stamping or die casting.

Provided are integrated power electronics modules (IPEM) including a power inverter module integrated with a component and a damping cover. The damping cover can include an aluminum foam core including a top surface generally corresponding to a top side of the damping cover and a bottom surface generally corresponding to a bottom side of the damping cover, and a non-porous aluminum outer layer covering the top side of the aluminum foam core and/or a non-porous aluminum outer layer covering the bottom side of the aluminum foam core. The bottom side of the damping cover can be configured to mate adjacent with or contiguous to the power inverter module. The aluminum foam core and the non-porous aluminum outer layer covering the top side of the aluminum foam core and/or the non-porous aluminum outer layer covering the bottom side of the aluminum foam core can be a monolith. The non-porous aluminum outer layer covering the top side of the aluminum foam core and/or the non-porous aluminum outer layer covering the bottom side of the aluminum foam core each can be aluminum sheets joined to the aluminum foam core. The aluminum sheet(s) can be joined to the aluminum foam core by brazing, press-fitting, stamping, welding, mechanical fasteners, or adhering via a polymer over-molding. The damping cover can dampen noise created by the power inverter module, and/or can absorb vibration created by the component. The component can be a motor/generator, a clutch, a pump, a cooler, a DC-link capacitance and gate drive unit, an intelligent power module, and combinations thereof.

Provided are integrated power electronics modules (IPEM) including a power inverter module integrated with a component and a damping cover. The damping cover can include an aluminum foam core including a top surface generally corresponding to a top side of the damping cover and a bottom surface generally corresponding to a bottom side of the damping cover, and a polymeric material over-molding covering the top surface and/or the bottom surface of the aluminum foam core. The bottom side of the damping cover can be configured to mate adjacent with or contiguous to the power inverter module. The polymeric material over-molding can completely impregnate the aluminum foam core. The component can be a motor/generator, a clutch, a pump, a cooler, a DC-link capacitance and gate drive unit, an intelligent power module, and combinations thereof. The damping cover can dampen noise created by the power inverter module, and/or can absorb vibration created by the component.

Other objects, advantages and novel features of the exemplary embodiments will become more apparent from the following detailed description of exemplary embodiments and the accompanying drawings.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
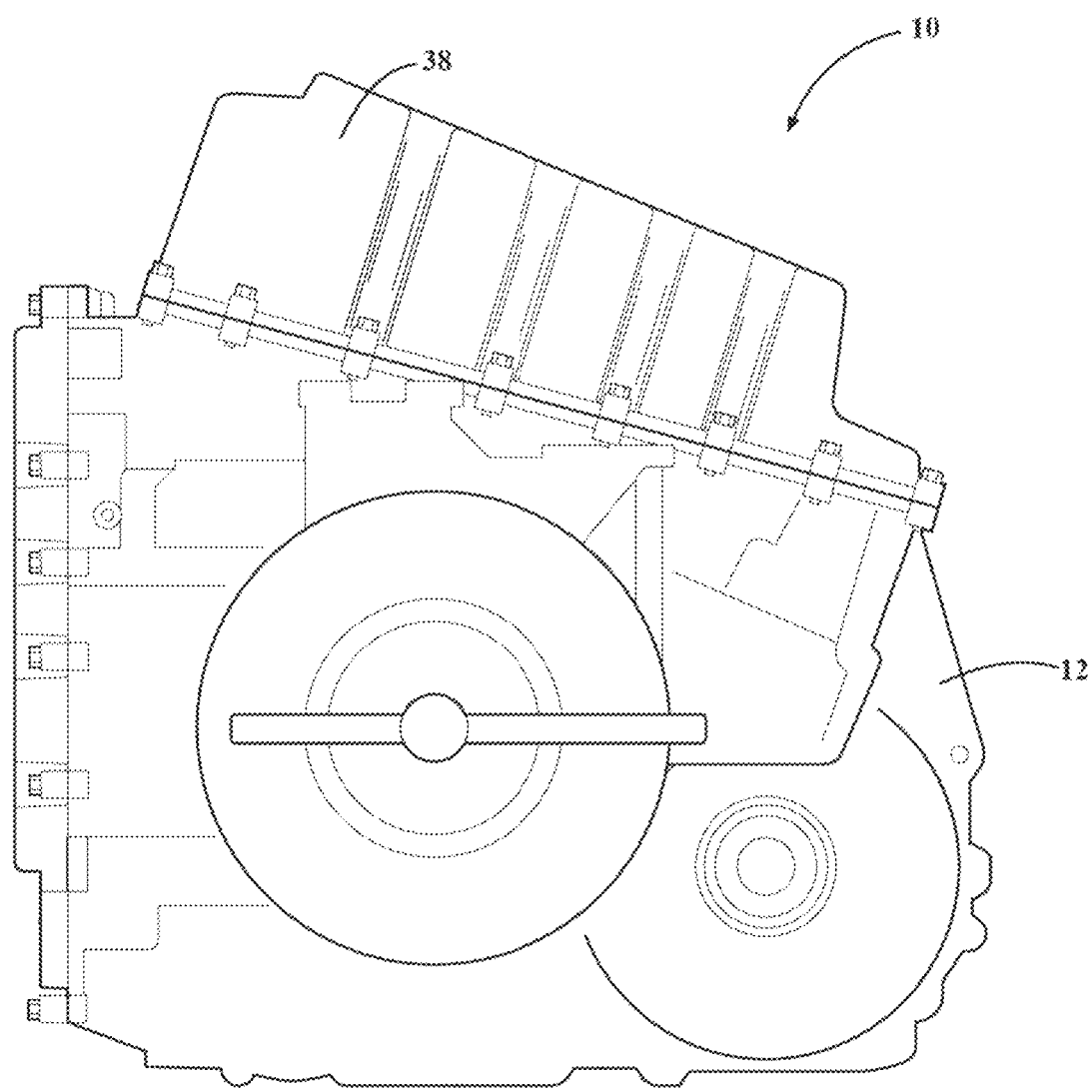
FIG. 1 illustrates a side view of an integrated power electronics module, according to one or more embodiments herein.
Figure 2:
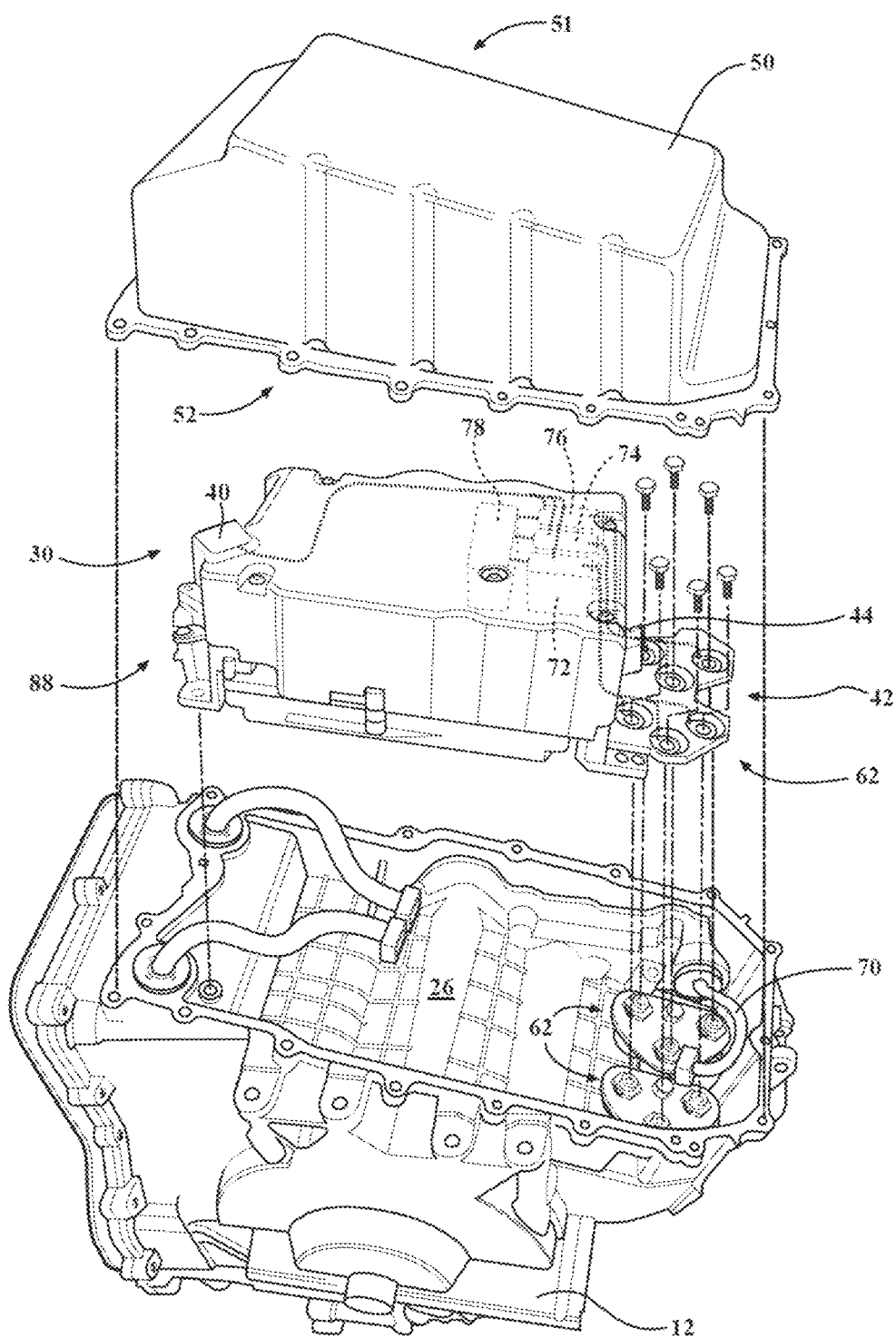
FIG. 2 illustrates an exploded perspective view of an integrated power electronics module, according to one or more embodiments herein.

Referring to the Figures, wherein like numerals indicate like or corresponding parts throughout the several views, an integrated power electronics module (IPEM) 10, for example as utilized by a vehicle, is generally shown in FIGS. 1-2. It will be understood that many of the elements and components described herein are omitted or represented schematically in the figures for clarity. FIG. 1 illustrates a side view of the IPEM 10 and FIG. 2 illustrates an exploded perspective view of the IPEM 10. The IPEM 10 comprises a power inverter module (PIM) 30 and one or more components. For example, the one or more components can comprise motor/generator(s), clutch(es), pump(s), coolers, DC-link capacitance and gate drive units, intelligent power modules (IPM), and combinations thereof, among others. An IPM can comprise a plurality of power stages wherein each power state includes dedicated gate drive protection circuitry. An IPM can be integrated with an input rectifier and power factor correction stages, for example. A pump can circulate coolant within a coolant system (not shown), for example. In one embodiment, the IPEM 10 can comprise an electrically-variable transmission, such as an electrically-variable transmission for a hybrid or electric vehicle. In other embodiments, the IPEM can comprise a drive unit, such as a drive unit for a hybrid or electric vehicle.

The IPEM 10 can comprise a casing 12 configured to receive one or more components and the PIM 30. The casing 12 can comprise a partition 26 defining a lower portion of the casing 12 for housing the one or more components and an upper portion of the casing 12 for housing the PIM 30, for example. A cover 50 can attach to the casing 12 to contain the power inverter module within the upper portion of the casing 12 and further provides acoustic and vibrational damping as will be described below. The cover 50 can be selectively attached/detached to/from the casing 12, and is shown in a first, attached position for containing the PIM 30 in FIG. 1 and a second, detached position (e.g., for removing/inspecting/replacing the PIM 30) in FIG. 2. When the cover 50 is in the first position, the PIM 30 can be closed or sealed such that the PIM 30 remains dry. It is to be appreciated that any suitable seal, gasket, etc. can be disposed between the casing 12 and the cover 50 to assist in closing or sealing in the first position.

Generally, the PIM 30 is configured to receive direct current energy, convert the direct current energy to alternating current energy, and output the alternating current energy to the one or more components. The PIM 30 can include a first junction 40 for receiving the direct current energy, and multiple output junctions (e.g., second junction 42 and a third junction 44) each for outputting the alternating current energy. The PIM further comprises a plurality of inverters (e.g., the first, second and third inverters 72, 74, 76) in communication with a controller 78 and configured to convert the direct current energy received by the first junction 40 and output the alternating current energy to the multiple output junctions (e.g., second junction 42 and a third junction 44). For example, an interface assembly 62 can electrically connect the second junction 42 to one or more motor/generators (not shown) and a cable harness 70 can be coupled to the third junction 44 and a motor (not shown) of a pump (not shown) to deliver alternating current energy from the PIM 30 to the one or more motor/generators and the pump. The controller 78 can be connected to other vehicle systems for communication therewith, for example.

During operation of the IPEM 10, undesirable noise and vibration may be created by the PIM and one or more components. Accordingly, provided herein are covers (e.g., cover 50) for IPEMs 10 for damping undesirable noise and vibrations. The covers 50 also provide electromagnetic shielding.

Figure 3A:
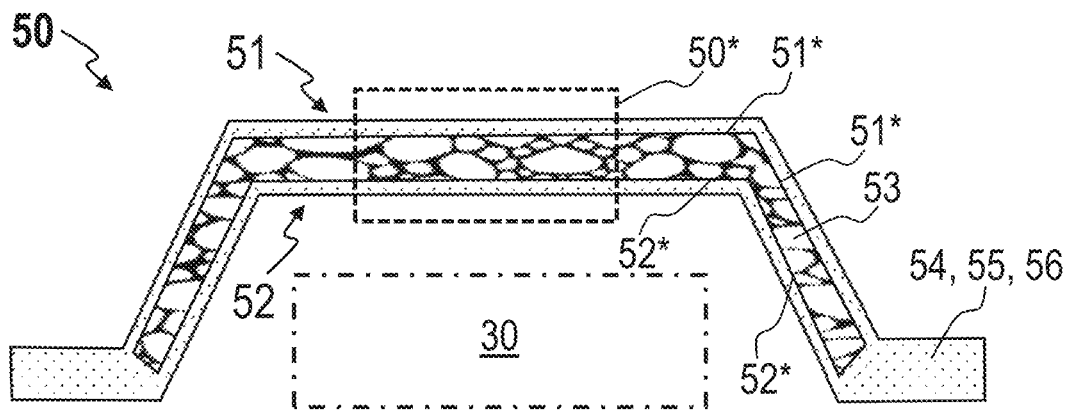
FIG. 3A illustrates a schematic cross-sectional side view of a damping cover, according to one or more embodiments herein.

FIG. 3A illustrates a schematic cross-sectional side view of a damping cover 50 generally defined by a top side 51 and a bottom side 52, wherein the bottom side 52 is configured to mate adjacent with or contiguous to the PIM 30. The damping cover 50 comprises an aluminum foam core 53 including a top surface 51* generally corresponding to the top side 51 of the damping cover 50 and a bottom surface 52* generally corresponding to the bottom side 52 of the damping cover 50. The cover 50 can be planar, or non-planar, as shown in FIGS. 1-2, and generally surround all surfaces of the PIM 30 which are not contiguous with the integrated component(s) of the IPEM 10 or the partition 26, for example. The cover 50 and/or the aluminum foam core 53 can be formed into a non-planar geometry, such as the geometry illustrated in FIGS. 1, 2, and 3A, by stamping or die casting, for example.

The aluminum foam core 53 is a metal foam manufactured from pure aluminum and/or aluminum alloys, including wrought aluminum alloys (e.g., 2000, 3000, 4000, 5000, 6000, and 7000 series), and cast aluminum alloys (e.g., 200, 300, 400, 500 series), for example, although other alloys not listed herein may be similarly suitable. For corrosion-critical components comprising aluminum foam, copper-containing aluminum alloys are preferably not utilized. For components comprising aluminum foam and by significant plastic deformation of the aluminum foam, high-silicon content alloys (e.g., 300 series) are preferably not utilized.

The aluminum foam core 53 is defined by a plurality of pores, and accordingly includes a large volume fraction of gas-filled pores. The aluminum foam core 53 is preferably an open-cell foam in which the pores are all, or substantially, collectively in fluid communication. For example, the aluminum foam core 53 can comprise a density of about 0.15 g/cm$^3$ to about 1.0 g/cm$^3$, about 0.3 g/cm$^3$ to about 0.8 g/cm$^3$, or about 0.4 g/cm$^3$ to about 0.6 g/cm$^3$. The aluminum foam can comprise an average pore size of about 0.5 mm to about 15 mm, about 2 mm to about 10 mm, or about 3 mm to about 6 mm. A larger aluminum foam pore size can more easily accommodate polymer over-molding (e.g., lower pressures are required to impregnate the aluminum foam pores with polymer material), but larger pore sizes reduce the strength of the aluminum foam. Larger pore sizes also reduce the damping capability of unimpregnated aluminum foam.

Figure 3B:
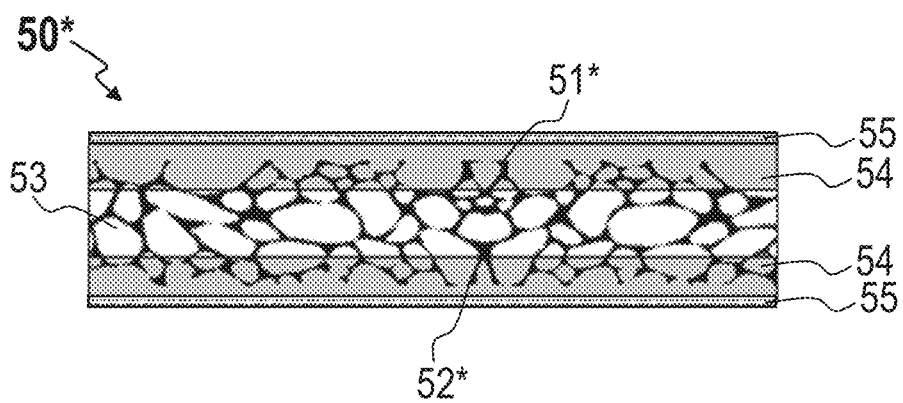
FIG. 3B illustrates a cross-sectional side view of a damping cover, according to one or more embodiments herein.
Figure 3C:
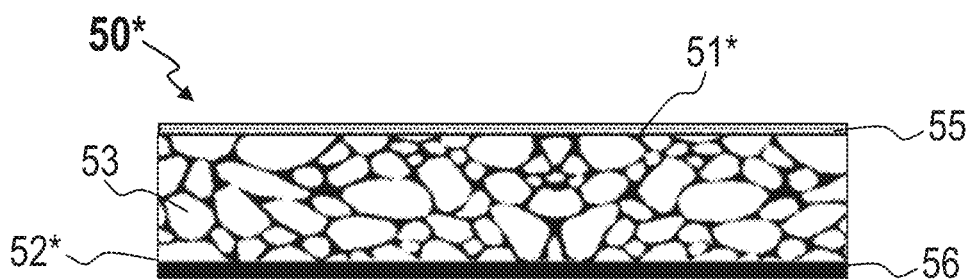
FIG. 3C illustrates a cross-sectional side view of a damping cover, according to one or more embodiments herein.

As shown in FIG. 3A, the top surface 51* and/or the bottom surface 52* of the aluminum foam core 53 can be covered with a polymeric material over-molding 54 and/or a non-porous aluminum outer layer. FIGS. 3B-C each illustrate a cross-sectional side view of the damping cover 50 from FIG. 3A in order to illustrate the various material orientations suitable for the damping cover 50. Polymeric material over-molding 54, as illustrated in FIG. 3B, at least partially impregnates the pores of the aluminum foam core 53 and can be applied to the top surface 51* and/or the bottom surface 52* of the aluminum foam core 53. In some embodiments, the polymeric material over-molding 54 substantially impregnates the entire aluminum foam core 53 (i.e., impregnates at least about 98% of all open-cell pores).

In some embodiments, the polymeric material over-molding 54 entirely encases the aluminum foam core 53. The polymeric material can comprise one or more elastomers, one or more thermoplastics, one or more thermosets, and combinations thereof. Elastomers can include nitrile rubber, styrenebuatadiene rubber, ethylenepropylenediene rubber, butyl rubber, natural rubber, butadiene rubber, silicone rubber, polychloroprene, and polynorbornene, among others. Thermoplastics can include poly(vinylacetate), poly(vinylalcohol), poly(vinylchloride), polyethylene, polypropylene, polystyrene, poly(methylmethacrylate), polycarbonate, poly(ethyleneterephthalate), poly(styrene-acrylonitrile), poly(acrylic-styrene-acrylonitrile), polyetheretherketone, polyimides, and poly(lactic acid), among others. Thermosets can include epoxy, polyurethane, polyurea, and unsaturated polyester, among others.

In some embodiments, the polymeric material over-molding 54 can be covered with an aluminum plate layer 55 on the top side 51\* and/or the bottom side 52\* of the aluminum foam core 53. The aluminum plate layer 55 can comprise pure aluminum and aluminum alloys, as disclosed above, for example. The one or more aluminum plate layers 55 can be joined to the aluminum foam core 53 by brazing, pressfitting, stamping, welding, mechanical fasteners, or adhering via a polymer over-molding 54, for example.

In other embodiments, the damping cover 50 can comprise a non-porous aluminum outer layer covering the top side of the aluminum foam core and/or a non-porous aluminum outer layer covering the bottom side of the aluminum foam core, as shown in FIG. 3C. The non-porous aluminum outer layer can comprise an aluminum plate layer 55. Alternatively, the aluminum foam core 53 and the non-porous aluminum outer layer covering the top side 51\* of the aluminum foam core 53 and/or the non-porous aluminum outer layer covering the bottom side 52\* of the aluminum foam core 53 can comprise a monolith having an integral non-porous outer surface 56. For example, non-porous outer surface(s) can be formed in-situ during the fabrication of the aluminum foam core to form the non-porous outer surface 56.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

The invention claimed is:

1. A damping cover for an integrated power electronics module (IPEM),
the IPEM including an IPEM casing and a power inverter module (PIM) attached to the IPEM casing,
the IPEM casing defining an internal chamber within which is housed the PIM,
the damping cover comprising:
a damping cover body including opposing top and bottom sides,
the damping cover body configured to sealingly mount to the IPEM casing such that the bottom side is adjacent the PIM and the PIM is enclosed between the damping cover body and the IPEM casing,
the damping cover body including:
an aluminum foam core including a top surface corresponding to the top side of the damping cover body and a bottom surface corresponding to the bottom side of the damping cover body;
a polymeric material over-molding covering the top surface of the aluminum foam core; and
an aluminum plate layer covering a top surface of the polymeric material over-molding and forming an outermost surface of the top side of the damping cover body.

2. The damping cover of claim 1, wherein the polymeric material over-molding covers the bottom surface of the aluminum foam core and forms an outermost surface of the bottom side of the damping cover body.

3. The damping cover of claim 1, wherein the aluminum foam core comprises a density of 0.15 grams per cubic centimeter to 1.0 grams per cubic centimeter.

4. The damping cover of claim 1, wherein the aluminum foam core comprises an average pore size of 0.5 millimeters to 15 millimeters.

5. The damping cover of claim 1, wherein the aluminum foam core comprises pure aluminum or one or more aluminum alloys.

6. The damping cover of claim 1, wherein the polymeric material over-molding comprises one or more elastomers, one or more thermoplastics, and/or one or more thermosets.

7. The damping cover of claim 1, wherein the aluminum foam core is formed into a non-planar geometry by stamping or die casting.

8. The damping cover of claim 1, wherein the damping cover body includes a top, multiple interconnected sidewalls integral with and projecting from the top, and a mounting flange integral with and projecting outwards from bottom ends of the sidewalls, the mounting flange configured to receive a plurality of fasteners to thereby mount the damping cover onto the IPEM casing.

9. An integrated power electronics module (IPEM), comprising:
an IPEM casing defining therein an internal chamber;
a power inverter module (PIM) attached to the IPEM casing and located within the internal chamber;
a component attached to the IPEM casing; and
a damping cover attached to the IPEM casing adjacent the PIM such that the PIM is enclosed between the damping cover body and the IPEM casing,
the damping cover including:
an aluminum foam core including a top surface corresponding to a top side of the damping cover and a bottom surface corresponding to a bottom side of the damping cover,
a polymeric material covering the top surface and/or the bottom surface of the aluminum foam core, and
a non-porous aluminum outer layer covering top surface and/or a bottom surface of the polymeric material and forming outermost exterior surfaces of the top and/or bottom sides of the damping cover.

10. The IPEM of claim 9, wherein the non-porous aluminum outer layer is integral to the aluminum foam core to collectively define a monolith therewith.

11. The IPEM of claim 10, wherein the non-porous aluminum outer layer is formed in-situ during fabrication of the aluminum foam core.

12. The IPEM of claim 9, wherein the non-porous aluminum outer layer comprises aluminum sheets joined to the aluminum foam core.

13. The IPEM of claim 12, wherein the aluminum sheets are joined to the aluminum foam core by brazing, press-fitting, stamping, welding, or mechanical fasteners.

14. The IPEM of claim 9, wherein the damping cover dampens noise created by the power inverter module, and/or absorbs vibration created by the component.

15. The IPEM of claim 9, wherein the component comprises a motor/generator, a clutch, a pump, a cooler, a DC-link capacitance and gate drive unit, and/or an intelligent power module.

16. An integrated power electronics module (IPEM), comprising:
    an IPEM casing with first and second internal portions separated by a partition;
    a component located inside the first portion;
    a power inverter module (PIM) located inside the second portion; and
    a damping cover adjacent the PIM and sealingly mounted to the IPEM casing to enclose therebetween the PIM, the damping cover including:
    an aluminum foam core including a top surface corresponding to a top side of the damping cover and a bottom surface corresponding to a bottom side of the damping cover,
    a polymeric material over-molding covering the top and bottom surfaces of the aluminum foam core, and
    an aluminum plate layer covering top and bottom surfaces of the polymeric material over-molding and forming an outermost exterior surface of the top side of the damping cover and an outermost exterior surface of the bottom side of the damping cover.

17. The IPEM of claim 16, wherein the polymeric material over-molding completely impregnates the aluminum foam core.

18. The IPEM of claim 16, wherein the component comprises a motor/generator, a clutch, a pump, a cooler, a DC-link capacitance and gate drive unit, and/or an intelligent power module.

19. The IPEM of claim 16, wherein the power inverter module is configured to receive direct current energy, convert the direct current energy to alternating current energy, and output the alternating current energy, and wherein the component is a motor/generator unit electrically connected to the PIM to receive therefrom the alternating current energy.

* * * * *